United States Patent
Camacho et al.

(10) Patent No.: US 8,810,015 B2
(45) Date of Patent: Aug. 19, 2014

(54) INTEGRATED CIRCUIT PACKAGING SYSTEM WITH HIGH LEAD COUNT AND METHOD OF MANUFACTURE THEREOF

(75) Inventors: Zigmund Ramirez Camacho, Singapore (SG); Henry Descalzo Bathan, Singapore (SG); Frederick Rodriguez Dahilig, Singapore (SG)

(73) Assignee: STAT ChipPAC Ltd., Singapore (SG)

( * ) Notice: Subject to any disclaimer, the term of this patent is extended or adjusted under 35 U.S.C. 154(b) by 465 days.

(21) Appl. No.: 12/484,245

(22) Filed: Jun. 14, 2009

(65) Prior Publication Data

US 2010/0314731 A1    Dec. 16, 2010

(51) Int. Cl.
*H01L 21/44* (2006.01)

(52) U.S. Cl.
USPC .......................................... 257/676; 438/123

(58) Field of Classification Search
CPC ................ H01L 2924/00; H01L 2224/48247; H01L 2224/73265; H01L 2924/00014; H01L 2224/48091; H01L 2224/32245
USPC ............ 257/676, E21.502, E23.031; 438/123
See application file for complete search history.

(56) References Cited

U.S. PATENT DOCUMENTS

| | | | |
|---|---|---|---|
| 5,200,362 A | 4/1993 | Lin et al. | |
| 6,008,528 A * | 12/1999 | Go et al. | 257/670 |
| 6,072,239 A | 6/2000 | Yoneda et al. | |
| 6,818,973 B1 | 11/2004 | Foster | |
| 6,876,068 B1 | 4/2005 | Lee et al. | |
| 7,057,280 B2 | 6/2006 | Yee et al. | |
| 7,067,908 B2 | 6/2006 | Jang | |
| 7,170,150 B2 | 1/2007 | Lee | |
| 7,211,471 B1 | 5/2007 | Foster | |
| 7,323,765 B2 | 1/2008 | Lam | |
| 7,354,796 B2 | 4/2008 | Huang et al. | |
| 7,411,289 B1 | 8/2008 | McLellan et al. | |
| 7,968,998 B1 * | 6/2011 | Choi | 257/693 |
| 2002/0048948 A1 * | 4/2002 | Gang | 438/684 |
| 2007/0284733 A1 * | 12/2007 | Leung et al. | 257/712 |
| 2008/0157401 A1 * | 7/2008 | Kim | 257/787 |
| 2009/0283878 A1 * | 11/2009 | Fan et al. | 257/670 |
| 2009/0302442 A1 * | 12/2009 | Camacho et al. | 257/667 |

OTHER PUBLICATIONS

U.S. Appl. No. 12/467,146, May 15, 2009, Camacho et al.

* cited by examiner

*Primary Examiner* — Duy T Nguyen
(74) *Attorney, Agent, or Firm* — Ishimaru & Associates LLP

(57) ABSTRACT

A method of manufacture of an integrated circuit packaging system includes: forming a leadframe with a tiebar and an outer lead having an outer lead outer pad; forming an inner lead on a peel strip; attaching the leadframe to the peel strip around the inner lead; wire bonding a die to the outer lead and the inner lead; encapsulating the die and portions of the outer lead and the inner lead; removing the peel strip to expose a bottom surface of the inner lead; and removing the leadframe to have the outer lead outer pad of the outer lead coplanar with the bottom surface of the inner lead.

18 Claims, 6 Drawing Sheets

INTEGRATED CIRCUIT PACKAGING SYSTEM WITH HIGH LEAD COUNT AND METHOD OF MANUFACTURE THEREOF

TECHNICAL FIELD

The present invention relates generally to an integrated circuit packaging system and more particularly to a system for an integrated circuit packaging system with a peel strip and high lead count.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Typically, the packages on which these integrated semiconductor chips are mounted include a substrate or other chip-mounting device. One example of such a substrate is a leadframe. Leadframes typically include an area on which an integrated circuit chip is mounted and multiple power, ground, and/or signal leads to which power, ground, and/or signal sites of the integrated semiconductor chip are electronically attached. Semiconductor integrated chips may be attached to the leadframe using adhesive or any other techniques for attaching such chips to a leadframe which are commonly known to those skilled in the art. The power, ground and/or signal sites on the chip may then be electrically connected to individual leads of the leadframe through techniques such as wire bonding.

A conventional leadframe includes a die pad, surrounded by a number of leads. Usually the leadframe is made from metal. In order for the leadframe to be handled as a single piece of substrate, connection elements are used to connect different parts of the leadframe together. The leads are usually connected by the outer frame of the leadframe. A tiebar usually connects the die pad to the outer frame of the leadframe. The connection elements are usually made out of the same metal as the leadframe due to the fact that the entire leadframe structure, including the connection elements, is cut out from a single piece of metal plate during a metallurgical forming process.

The trend of the modern semiconductor industry is to integrate more and more functionally into one package. This trend requires an ever increasing number of leads to be present in the leadframe. One way of increasing the lead count of the leadframe is to form leads extending from the periphery of the die pad.

The packaging process starts with attaching an integrated circuit chip to the die pad using a conductive adhesive such as silver epoxy. The conductive adhesive is cured after the die attach. Then a wire bonding process is typically used to make electrical interconnections between the integrated circuit and the leads of the leadframe. After wire bonding, the leadframe with the integrated circuit attached is encapsulated using a mold compound.

That the leadframe after the stage of molding is still a single piece of connected metal suggests that all the leads are shorted together. A singulation process is used to cut the outer frame of the leadframe and thus separates the leads connected by the outer frame as well as separates individual semiconductor package apart. However, the leads that extend from the die pad are still shorted together and not separated. Usually a partial sawing process is employed to separate those leads. However, this partial sawing process creates certain problems because it makes the manufacturing process more complicated, it creates moisture pathway that introduces water moisture into the package that leads to device failures, it creates mechanical cracks in the package that leads to device failures, and it might cut too deep and damage other components of the package. Another problem with the partial sawing is that such a process prevents a more versatile lead layout from being realized. Usually there is only one row of leads extending from the die pad. If two rows of leads are desired, two steps of partial sawing would be required to separate them and the risks mentioned above associated with such partial sawing increase dramatically.

Thus, a need still remains for increasing the lead or pin count, providing a more versatile lead layout scheme, eliminating the partial sawing that introduces risks, and simplifying the manufacturing process for an integrated circuit package. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a leadframe with a tiebar and an outer lead having an outer lead outer pad; forming an inner lead on a peel strip; attaching the leadframe to the peel strip around the inner lead; wire bonding a die to the outer lead and the inner lead; encapsulating the die and portions of the outer lead and the inner lead; removing the peel strip to expose a bottom surface of the inner lead; and removing the leadframe to have the outer lead outer pad of the outer lead coplanar with the bottom surface of the inner lead.

The present invention provides an integrated circuit packaging system including: a tiebar and an outer lead; an inner lead with a bottom surface exposed; a die wire bonded to the outer lead and the inner lead; a mold compound encapsulating the die and portions of the outer lead and the inner lead; and an outer lead outer pad at an end of the outer lead, the outer lead outer pad being coplanar with the bottom surface of the inner lead.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
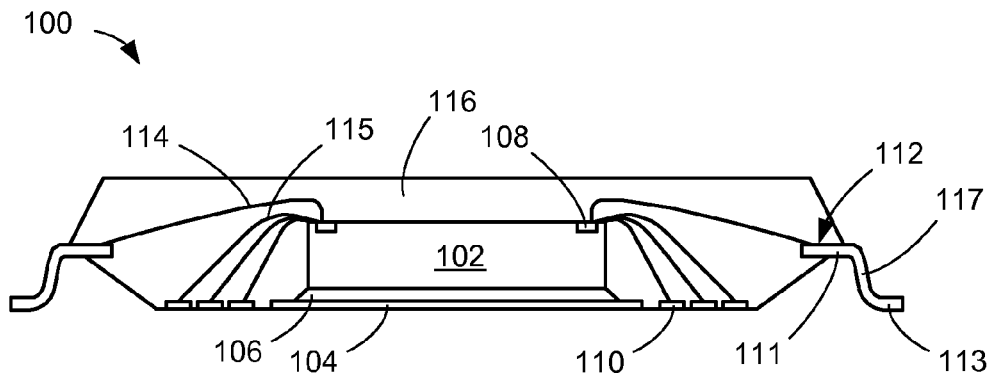
FIG. 1 is a cross-sectional view of an integrated circuit packaging system of a first embodiment of the present invention along line 1-1 of FIG. 2 after a stage of singulation.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawings FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "coplanar" is defined as being in the same plane or flat. With regard to an unfinished leadframe the term means that the unfinished leadframe is in one plane and flat as contrasted with having different heights.

Figure 2:
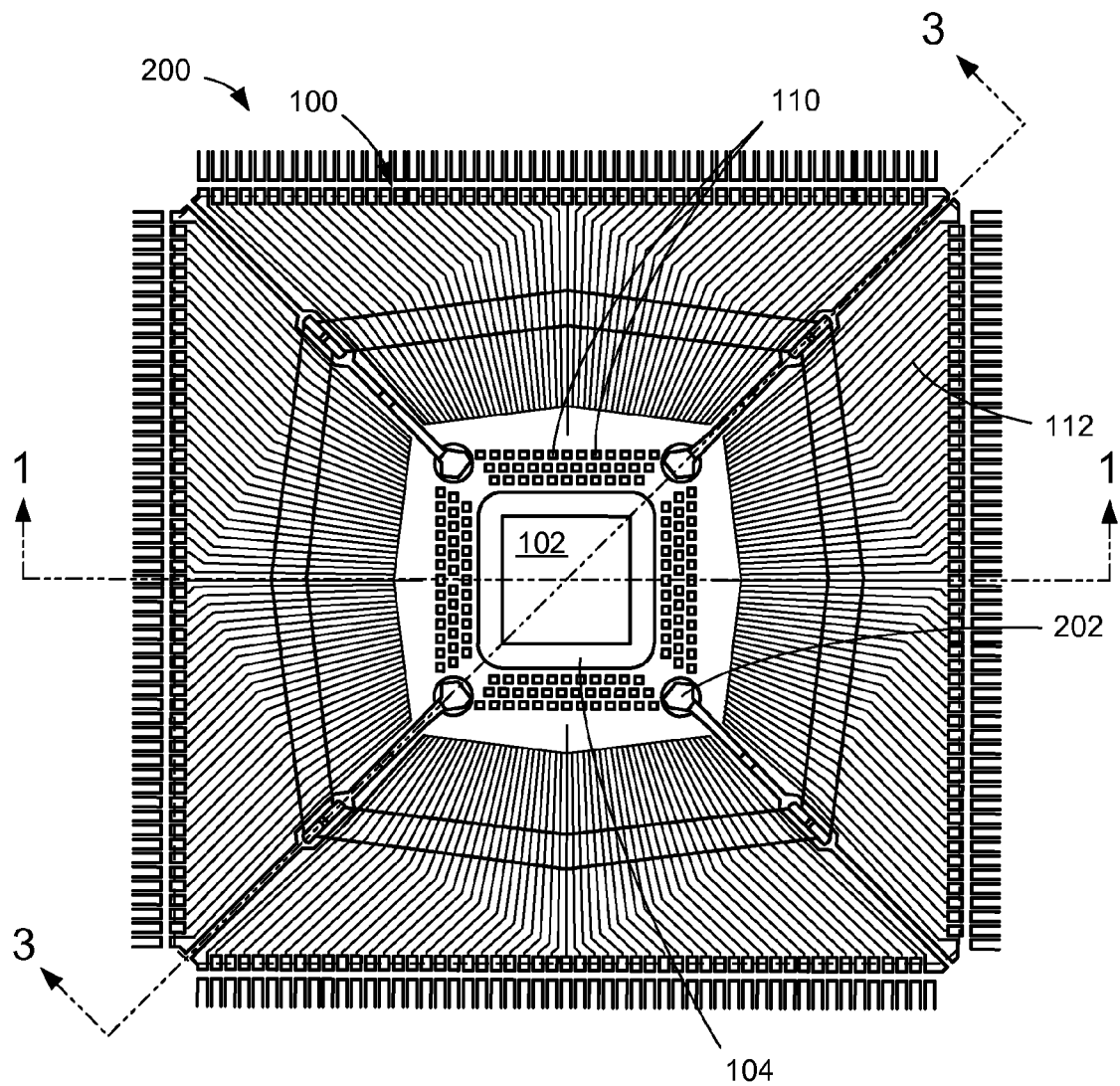
FIG. 2 is a top view of the integrated circuit packaging system of the first embodiment of the present invention after a stage of singulation.

Referring now to FIG. 1, therein is shown a cross-sectional view of an integrated circuit packaging system of a first embodiment of the present invention along line 1-1 of FIG. 2 after a stage of singulation.

An integrated circuit packaging system 100 is shown. The integrated circuit packaging system 100 has a die 102 attached to a die pad 104 through a die adhesive 106. The die 102 has a die bonding pad 108. The die bonding pad 108 is connected to an outer lead contact pad 111 of an outer lead 112 through a first bonding wire 114. The outer lead 112 also has an outer lead bend 117 and an outer lead outer pad 113. The die bonding pad 108 is also connected to an inner lead 110 through a second bonding wire 115. A bottom plane of the outer lead outer pad 113 has the same plane as the bottom surface of the inner lead 110.

The die 102, the die pad 104, the die adhesive 106, the die bonding pad 108, the inner lead 110, the outer lead contact pad 111, the first bonding wire 114, and the second bonding wire 115 are encapsulated by a mold compound 116. The bottom surfaces of the die pad 104 and the inner lead 110 are exposed and not encapsulated.

In the current embodiment of the present invention, there are three rows of the inner lead 110, of which, the inner lead 110 lying between the outer lead 112 and the inner lead 110 lying further away from the outer lead 112 is known as an intermediate lead. The inner lead 110 is coplanar with the outer lead outer pad 113. Both the inner lead 110 and the outer lead outer pad 113 serve as the means of connection to the outside world. It has been discovered that such a configuration, compared to a conventional integrated circuit packaging system that has only one row of such lead, enhances the level of integration of the integrated circuit packaging system, increases the lead count, and provides a more versatile lead layout scheme.

Referring now to FIG. 2, therein is shown a top view of the integrated circuit packaging system of the first embodiment of the present invention after a stage of singulation.

The integrated circuit packaging system 100 is shown. The die 102 is shown to be attached to the die pad 104. The inner lead 110 and the outer lead 112 is also shown. The inner lead 110 is shown arranged in three staggered rows of the inner lead 110. A tiebar 202 is shown adjacent the outer lead 112. For the purpose of a clearer view, the first bonding wire 114 and the mold compound 116 of FIG. 1 are not shown in FIG. 2.

Figure 3:
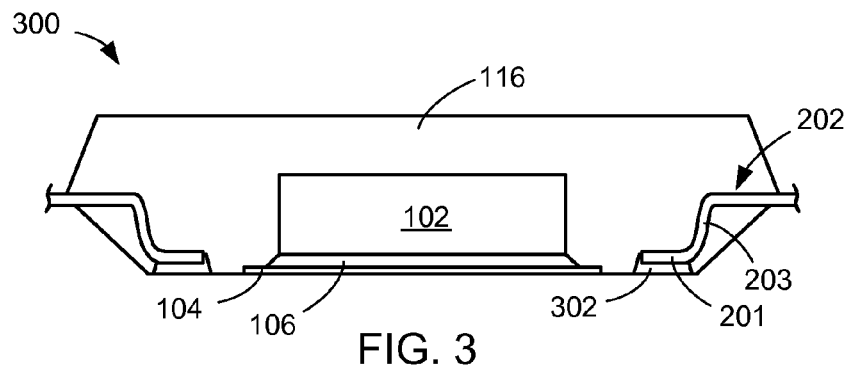
FIG. 3 is a cross-sectional view of the integrated circuit packaging system of the first embodiment of the present invention along line 3-3 of FIG. 2 after a stage of singulation.

Referring now to FIG. 3, therein is shown a cross-sectional view of the integrated circuit packaging system of the first embodiment of the present invention along line 3-3 of FIG. 2 after a stage of singulation.

The die 102 is shown to be attached to the die pad 104 through the die adhesive 106. The tiebar 202 has a tiebar contact pad 201 and a tiebar bend 203. The tiebar contact pad 201 is attached to a glue 302. The adhesion element, such as the glue 302. is exposed from the bottom side of the mold compound 116. The exposed side of the adhesion element is coplanar with the bottom side of the die pad 104 and the bottom side of the mold compound 116. The adhesion element is directly on the molding compound 116 and the tiebar contact pad 201. The adhesion element is between the tiebar contact pad 201 and the bottom side of the mold compound 116.

The die 102, the die pad 104, the die adhesive 106, the tiebar contact pad 201, the tiebar bend 203, and the glue 302 are encapsulated by the mold compound 116. The bottom surface of the glue 302 is also exposed.

Figure 4:
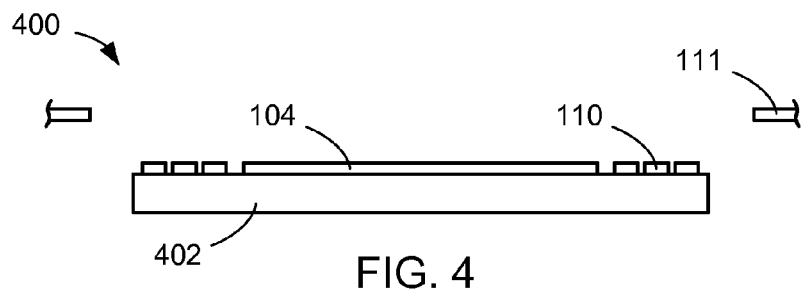
FIG. 4 is a cross-sectional view of a leadframe of the first embodiment of the present invention along line 4-4 of FIG. 5 after an intermediate stage of the process.
Figure 5:
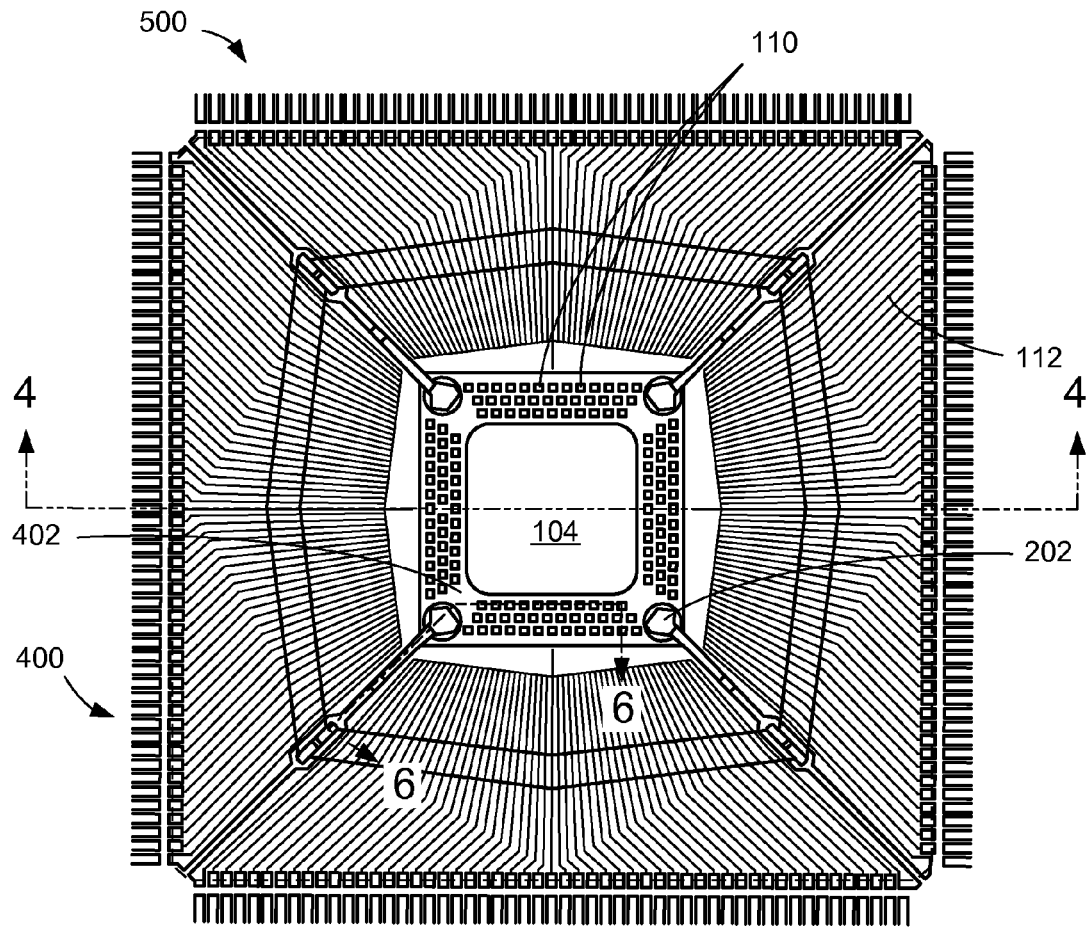
FIG. 5 is a top view of the leadframe of the first embodiment of the present invention after the intermediate stage of the process.

Referring now to FIG. 4, therein is shown a cross-sectional view of a leadframe 400 of the first embodiment of the present invention along line 4-4 of FIG. 5 after an intermediate stage of the process.

The leadframe 400 is shown. The leadframe 400 has a peel strip 402. The die pad 104 and the inner lead 110 are attached to the peel strip 402. The peel strip 402 is typically made out of stainless steel. The outer lead contact pad 111 is also shown. Both the die pad 104 and the inner lead 110 could be pre-plated.

Referring now to FIG. 5, therein is shown a top view of the leadframe of the first embodiment of the present invention after the intermediate stage of the process.

The leadframe 400 is shown to have the outer lead 112 and the tiebar 202. The peel strip 402 is connected to the tiebar 202. The die pad 104 and the inner lead 110 are attached to the top of the peel strip 402.

Figure 6:
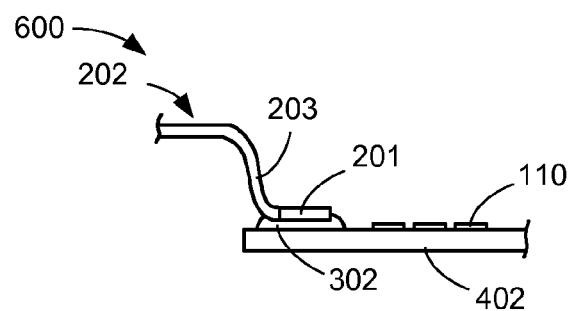
FIG. 6 is a cross-sectional view similar to FIG. 2 of the leadframe of the first embodiment of the present invention along line 6-6 of FIG. 5 after the intermediate stag of the process.

Referring now to FIG. 6, therein is shown a cross-sectional view similar to FIG. 2 of the leadframe of the first embodiment of the present invention along line 6-6 of FIG. 5 after the intermediate stag of the process.

It is shown that the tiebar contact pad 201 is attached to the peel strip 402 through the glue 302. A designed-in amount of spring-back could be employed in the tiebar 202 to ensure the planarity of the die pad 104 and the inner lead 110. The bottom side of the adhesion element, such as the glue 302, is coplanar with the bottom side of the inner lead 110 and the peel strip 402.

Figure 7:
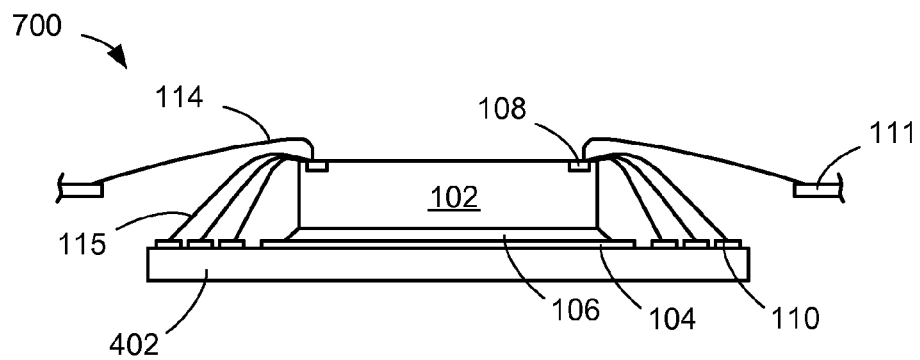
FIG. 7 is a cross-sectional view of the integrated circuit packaging system of the first embodiment of the present invention after a wire bonding stage.

Referring now to FIG. 7, therein is shown a cross-sectional view of the integrated circuit packaging system of the first embodiment of the present invention after a wire bonding stage.

The die 102 is attached to the die pad 104 through the die adhesive 106. The die bonding pad 108 is connected to the outer lead contact pad 111 through the first bonding wire 114. The die bonding pad 108 is also connected to the inner lead 110 through the second bonding wire 115.

Figure 8:
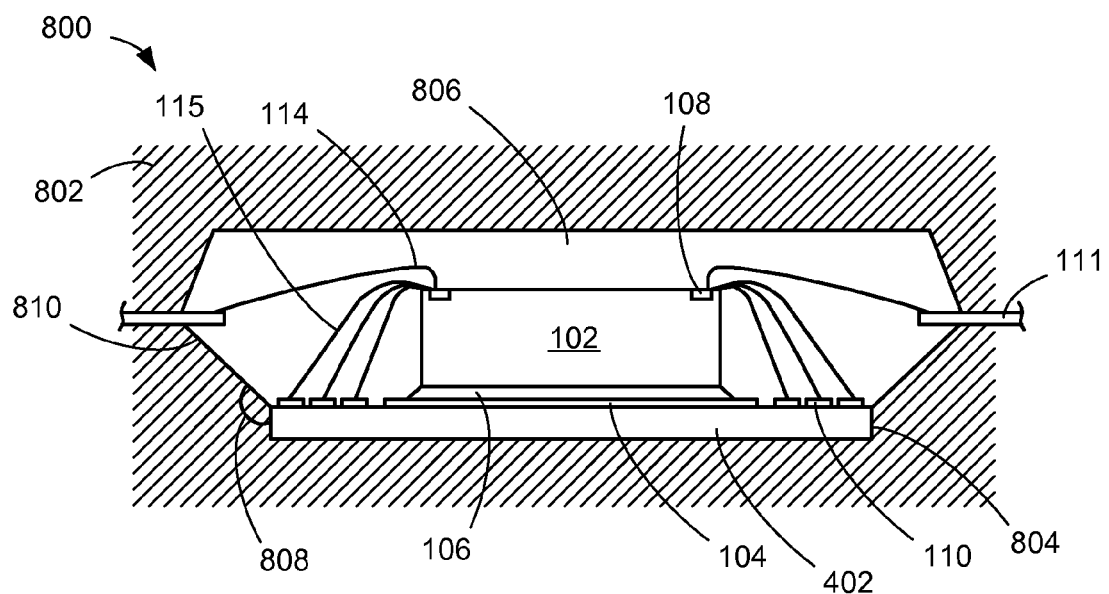
FIG. 8 is a cross-sectional view similar to FIG. 7 of the integrated circuit packaging system of the first embodiment of the present invention after a mold attaching stage.

Referring now to FIG. 8, therein is shown a cross-sectional view similar to FIG. 7 of the integrated circuit packaging system 800 of the first embodiment of the present invention after a mold attaching stage.

A mold case 802 is attached to a peel strip side wall 804 of the peel strip 402 of the leadframe 400 of FIG. 5. The mold case 802 has a mold cavity 806. The die 102, the die pad 104, the die adhesive 106, the inner lead 110, a portion of the outer lead contact pad 111, the first bonding wire 114, and the second bonding wire 115 are situated inside the mold cavity 806. The peel strip side wall 804 is at an angle 808 with a mold case side wall 810.

Figure 9:
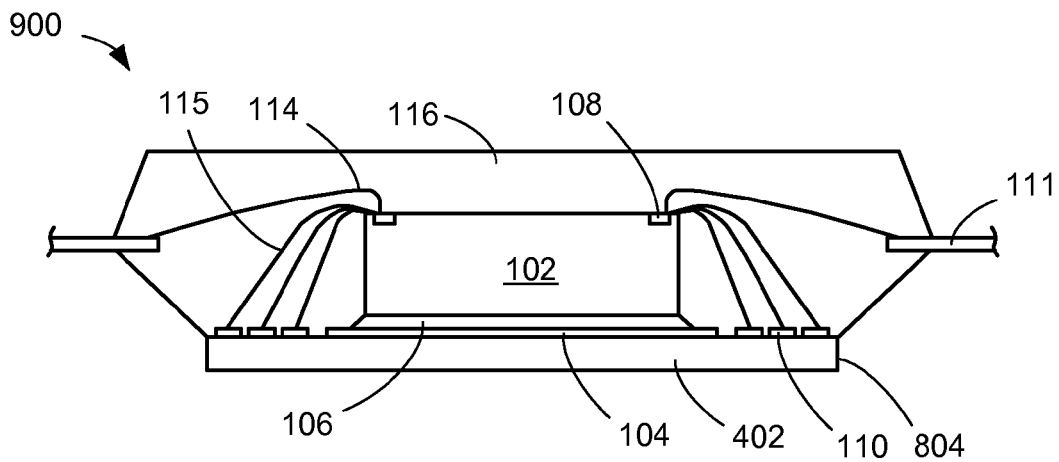
FIG. 9 is a cross-sectional view similar to FIG. 8 of the integrated circuit packaging system of the first embodiment of the present invention after a molding stage.

Referring now to FIG. 9, therein is shown a cross-sectional view similar to FIG. 8 of the integrated circuit packaging system of the first embodiment of the present invention after a molding stage.

The mold compound 116 is added to fill in the mold cavity 806 of FIG. 8. The mold case 802 of FIG. 8 is then removed. The die 102, the die pad 104, the die adhesive 106, the inner lead 110, a portion of the outer lead contact pad 111, the first bonding wire 114, and the second bonding wire 115 are encapsulated in the mold compound 116.

Figure 10:
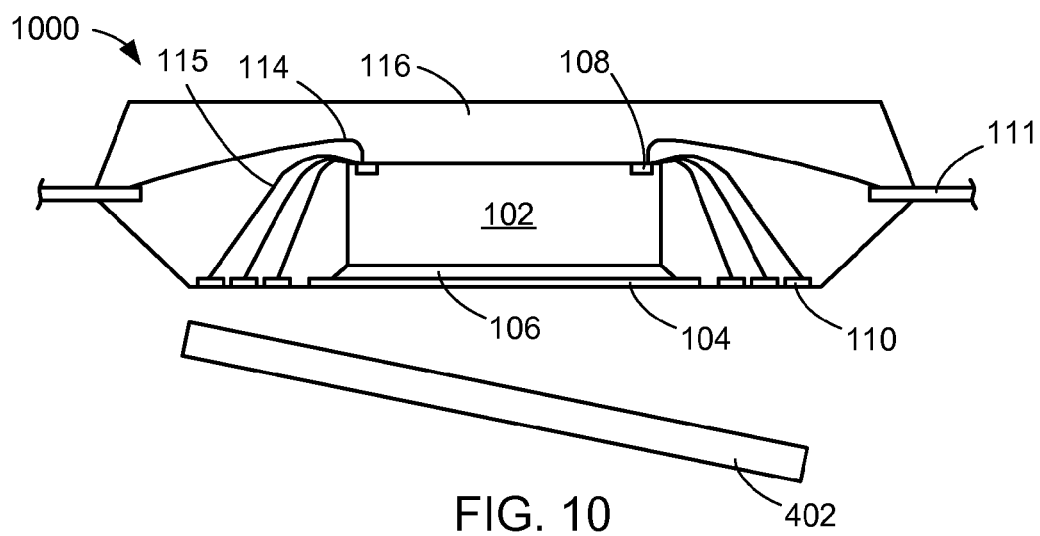
FIG. 10 is a cross-sectional view similar to FIG. 9 of the integrated circuit packaging system of the first embodiment of the present invention after a peeling stage.

Referring now to FIG. 10, therein is shown a cross-sectional view similar to FIG. 9 of the integrated circuit packaging system of the first embodiment of the present invention after a peeling stage.

The peel strip 402 is peeled away. A singulation process ensues and results in the integrated circuit packaging system 100 of FIG. 1.

The peeling process electrically separates the die pad 104 and the inner lead 110 which were previously held together by the peel strip 402. The bottom surfaces of the die pad 104 and inner lead 110 are also thus exposed for connection to outside components.

The current embodiment of the present invention employing the peeling process eliminates the partial sawing process conventionally employed to separate the die pad 104 and the inner lead 110 and it also eliminates all the risks and problems associated with the partial sawing. It has been discovered that the current embodiment of the present invention employing the peeling process makes the manufacturing process much simpler, eliminates the moisture pathway introduced by the partial sawing process, eliminates the mechanical cracks produced by the partial sawing process, and eliminates the deep cut created by the partial sawing process that usually leads to the damages of other components of the package.

The current embodiment of the present invention also makes possible a more versatile inner pad layout scheme. There are three rows of the inner lead 110 shown. It is very easy to introduce more than three rows of the inner lead 110 without incurring any additional risks usually accompanying the conventional partial sawing process. It has been discovered that such a configuration enhances the level of integration sophistication of the integrated circuit packaging system and increase the number of functionality in a single package.

Figure 11:
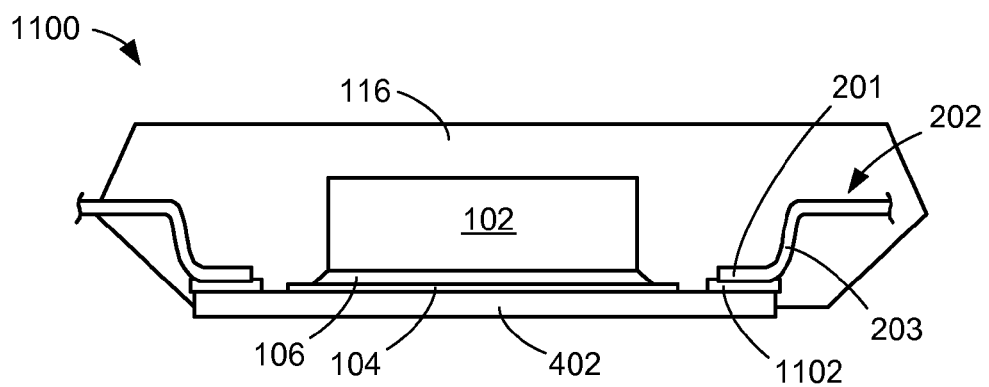
FIG. 11 is a cross-sectional view of an integrated circuit packaging system of a second embodiment of the present invention after a molding stage.

Referring now to FIG. 11, therein is shown a cross-sectional view of an integrated circuit packaging system of a second embodiment of the present invention after a molding stage.

In the current embodiment of the present invention, instead of using the glue 302 in FIG. 3 to attach the tiebar contact pad 201 to the peel strip 402, an adhesive tape 1102 is used to attach the tiebar contact pad 201 to the peel strip 402. The adhesion element, such as the adhesive tape 1102, is exposed from the bottom side of the mold compound 116 and coplanar with the bottom side of the die pad 104, the bottom side of the mold compound 116, and the peel strip 402. The adhesion element is directly on the molding compound 116 and the tiebar contact pad 201. The adhesion element is between the tiebar contact pad 201 and the bottom side of the mold compound 116.

Figure 12:
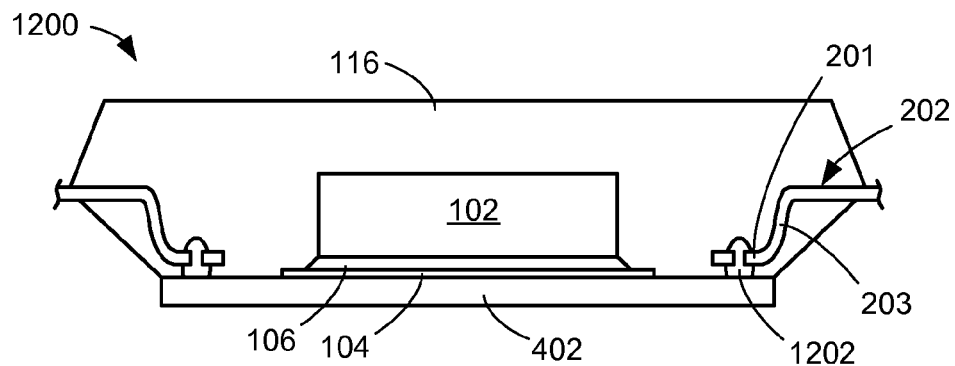
FIG. 12 is a cross-sectional view of an integrated circuit packaging system of a third embodiment of the present invention after a molding stage.

Referring now to FIG. 12, therein is shown a cross-sectional view of an integrated circuit packaging system of a third embodiment of the present invention after a molding stage.

In the current embodiment of the present invention, instead of using the glue 302 in FIG. 3 to attach the tiebar contact pad 201 to the peel strip 402, a solder ball 1202 is used to attach the tiebar contact pad 201 to the peel strip 402. The adhesion element, such as the solder ball 1202, is exposed from the bottom side of the mold compound 116 and coplanar with the bottom side of the die pad 104, the bottom side of the mold compound 116, and the peel strip 402. The adhesion element is between the tiebar contact pad 201 and the bottom side of the mold compound 116.

Figure 13:
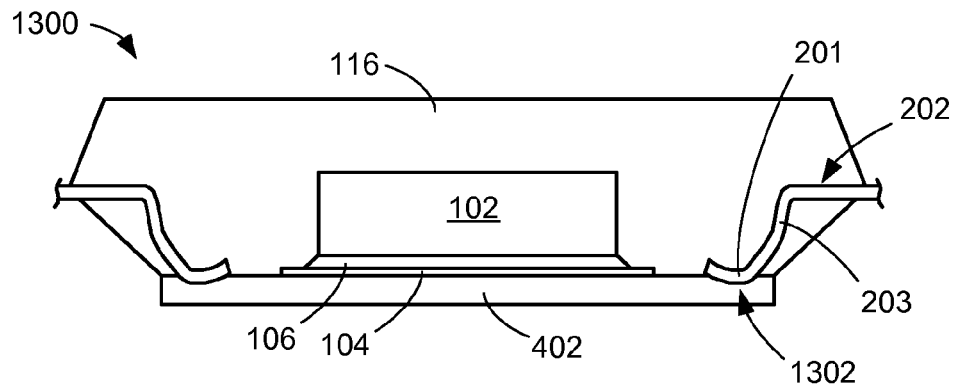
FIG. 13 is a cross-sectional view of an integrated circuit packaging system of a fourth embodiment of the present invention after a molding stage.

Referring now to FIG. 13, therein is shown a cross-sectional view of an integrated circuit packaging system of a fourth embodiment of the present invention after a molding stage.

In the current embodiment of the present invention, instead of using the glue 302 in FIG. 3 to attach the tiebar contact pad 201 to the peel strip 402, a metallic bond 1302 is formed between the tiebar contact pad 201 and the peel strip 402 to connect the tiebar contact pad 201 to the peel strip 402. The adhesion element, such as the metallic bond 1302, is exposed from the bottom side of the mold compound 116.

Figure 14:
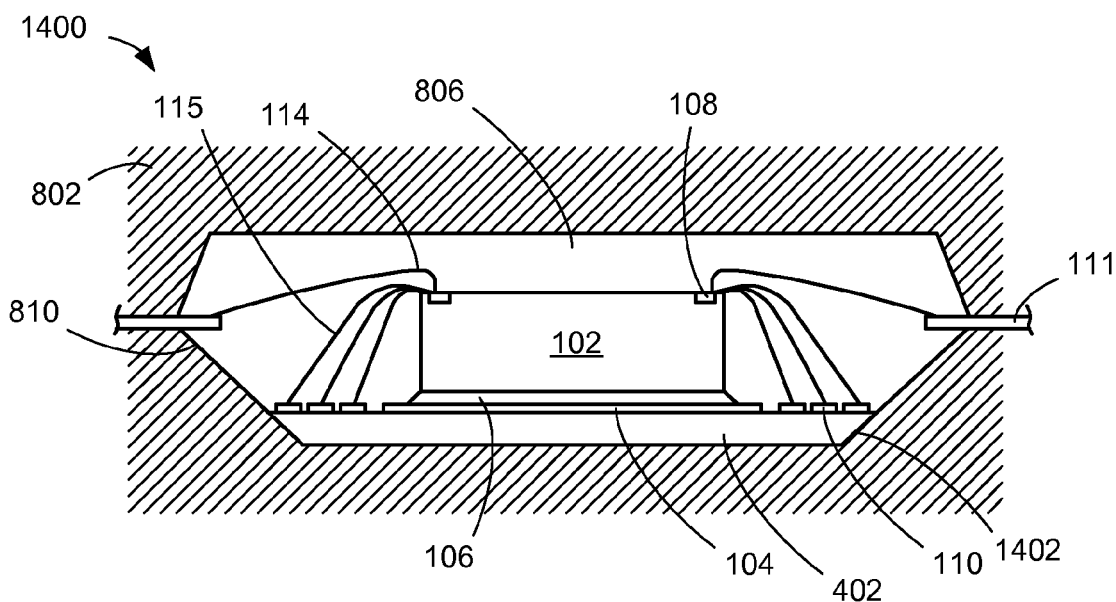
FIG. 14 is a cross-sectional view of an integrated circuit packaging system of a fifth embodiment of the present invention after a mold attaching stage.

Referring now to FIG. 14, therein is shown a cross-sectional view of an integrated circuit packaging system of a fifth embodiment of the present invention after a molding attaching stage.

Compared to FIG. 8, the peel strip 402 has a tapered peel strip side wall 1402 that is aligned with the mold case side wall 810 while in FIG. 8 the peel strip side wall 804 is at an angle 808 with the mold case side wall 810.

The configuration in FIG. 8 suffers from a problem called mold seepage. The fact that the peel strip side wall 804 is at an angle 808 with the mold case side wall 810 facilitates the mold compound 116 in FIG. 9 seeping through the connection between the peel strip side wall 804 and the mold case side wall 810 and form flickers of the mold compound 116 along the peel strip side wall 804. These flickers of the mold compound 116 reduce the reliability of the integrated circuit packaging system.

In the current embodiment of the present invention, the tapered peel strip side wall 1402 is aligned with the mold case side wall 810 and no angle exists between the tapered peel strip side wall 1402 and the mold case side wall 810. It has been discovered that such a configuration improves the seating fit of the mold case 802 and also eliminates the mold seepage problem and increases the reliability of the integrated circuit packaging system.

Figure 15:
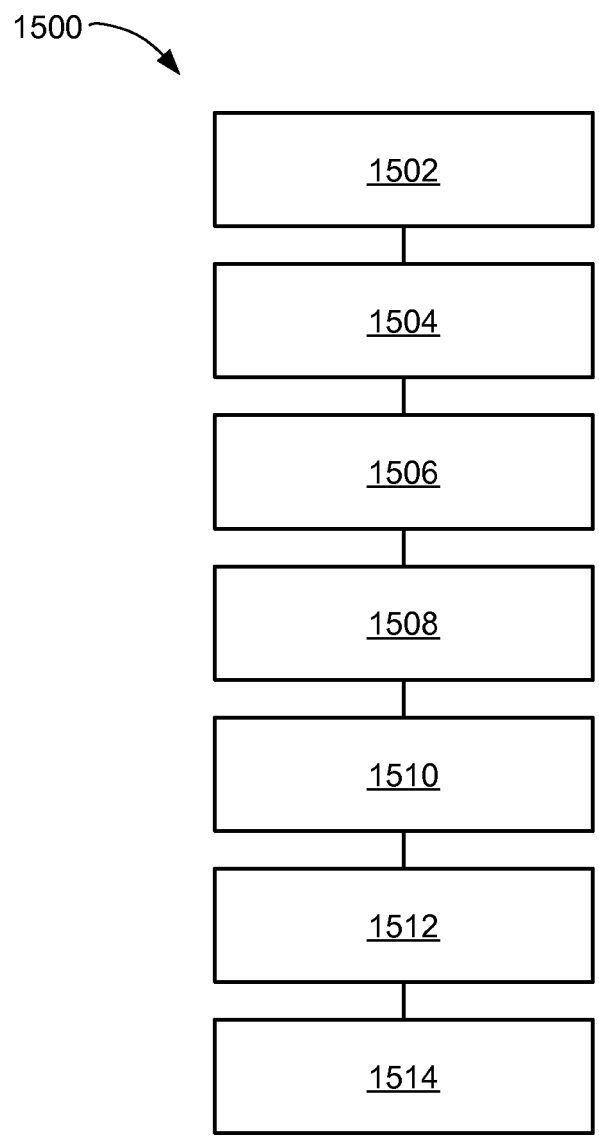
FIG. 15 is a flow chart of a method of manufacture of an integrated circuit packaging system in a further embodiment of the present invention.

Referring now to FIG. 15, therein is shown a flow chart of a method 1500 of manufacture of an integrated circuit packaging system in a further embodiment of the present invention. The method 1500 includes forming a leadframe with a tiebar and an outer lead having an outer lead outer pad in a block 1502; forming an inner lead on a peel strip in a block 1504; attaching the leadframe to the peel strip around the inner lead in a block 1506; wire bonding a die to the outer lead and the inner lead in a block 1508; encapsulating the die and portions of the outer lead and the inner lead in a block 1510; removing the peel strip to expose a bottom surface of the inner lead in a block 1512; and removing the leadframe to have the outer lead outer pad of the outer lead coplanar with the bottom surface of the inner lead in a block 1514.

It is discovered that the present invention increases lead or pin count, provides a more versatile lead layout scheme, eliminates the partial sawing that introduces risks, increases integrated circuit packaging system reliability, and simplifies the manufacturing process for an integrated circuit packaging system. The present invention thus facilitates and accommodates the modern trend of semiconductor packaging of integrating more and more device functionality in an ever-shrinking footprint.

Another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system of the present invention furnishes important and heretofore unknown and unavailable solutions, capabilities, and functional aspects for improving yield, increasing reliability, reducing complexity, and reducing cost of integrated circuit system. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package system fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:
1. A method of manufacture of an integrated circuit packaging system comprising:
    forming a leadframe with a tiebar having a tiebar contact pad and an outer lead having an outer lead outer pad;
    forming inner leads arranged in staggered rows on a peel strip;
    attaching the leadframe to the peel strip around the inner leads;
    wire bonding a die to the outer lead and the inner leads;
    forming an adhesion element directly on the tiebar contact pad and between the tiebar contact pad and the peel strip;
    encapsulating the die and portions of the outer lead and the inner leads with a mold case having a mold case sidewall to form a mold compound, the mold case side wall being aligned with a tapered peel strip side wall without any angles therebetween;
    removing the peel strip to expose a bottom surface of the inner lead and a portion of the adhesion element wherein the portion of the adhesion element is coplanar with the mold compound; and
    removing the leadframe to have a bottom plane of the outer lead outer pad having the same plane as the bottom surface of the inner leads.
2. The method as claimed in claim 1 further comprising:
    forming a die pad on the peel strip; and
    attaching the die to the die pad.
3. The method as claimed in claim 1 further comprising forming an intermediate lead on the peel strip between the outer lead and the inner leads lying further away from the outer lead.
4. The method as claimed in claim 1 wherein forming the leadframe includes forming the tiebar with the tiebar contact pad at the end thereof and attaching the leadframe to the peel strip includes attaching the leadframe by the tiebar contact pad thereof.
5. The method as claimed in claim 1 wherein the mold compound having an exposed surface coplanar with the bottom of the inner leads.
6. A method of manufacture of an integrated circuit packaging system comprising:

forming a leadframe with a tiebar having a tiebar contact pad and an outer lead having an outer lead outer pad;

forming inner leads arranged in staggered rows on a peel strip;

attaching the leadframe to the peel strip around the inner leads by the tiebar contact pad at the end of the tiebar;

forming an adhesion element directly on the tiebar contact pad and between the tiebar contact pad and the peel strip;

wire bonding a die to the outer lead and the inner leads;

encapsulating the die and portions of the outer lead and the inner leads with a mold case having a mold case sidewall to form a mold compound, the mold case sidewall being aligned with a tapered peel strip side wall without any angles therebetween;

removing the peel strip to expose a bottom surface of the inner lead and a portion of the adhesion element wherein the portion of the adhesion element is coplanar with the mold compound; and removing the leadframe to have a bottom plane of the outer lead outer pad having the same plane as the bottom surface of the inner leads.

7. The method as claimed in claim 6 wherein attaching the leadframe includes connecting the tiebar contact pad to the peel strip with the adhesion element where the adhesion element is a glue, an adhesive tape, or a solder ball.

8. The method as claimed in claim 6 wherein forming the adhesion element includes forming a metallic bond between the tiebar contact pad and the peel strip.

9. An integrated circuit packaging system comprising:

a tiebar having a tiebar contact pad;

an outer lead adjacent the tiebar; inner leads arranged in staggered rows with a bottom surface exposed;

a die wire bonded to the outer lead and the inner leads;

a mold compound encapsulating the die and portions of the outer lead and the inner leads, the mold compound having a tapered profile from the outer lead directly to the inner leads;

an adhesion element directly on the tiebar contact pad, a portion of the adhesion element exposed from and coplanar with a bottom side of the mold compound, and the adhesion element between the tiebar contact pad and the bottom side of the mold compound; and wherein:

the outer lead has an outer lead outer pad at an end of the outer lead, and a bottom plane of the outer lead outer pad having the same plane as the bottom surface of the inner leads.

10. The system as claimed in claim 9 further comprising a die pad, the die being attached to the die pad.

11. The system as claimed in claim 9 further comprising an intermediate lead between the outer lead and the inner leads lying further away from the outer lead.

12. The system as claimed in claim 9 wherein the tiebar has a designed-in amount of spring-back.

13. The system as claimed in claim 9 wherein the mold compound has an exposed surface coplanar with the bottom of the inner leads.

14. The system as claimed in claim 9 wherein the tiebar has the tiebar contact pad at the end of the tiebar.

15. The system as claimed in claim 14 wherein the adhesion element is a glue, an adhesive tape, or a solder ball.

16. The system as claimed in claim 14 wherein the adhesion is a metallic bond directly on the tiebar contact pad.

17. The system as claimed in claim 14 wherein a die pad or the inner leads are pre-plated.

18. The system as claimed in claim 14 wherein the die is connected to an outer lead contact pad of the outer lead with a first bonding wire.

* * * * *

UNITED STATES PATENT AND TRADEMARK OFFICE
CERTIFICATE OF CORRECTION

PATENT NO. : 8,810,015 B2  
APPLICATION NO. : 12/484245  
DATED : August 19, 2014  
INVENTOR(S) : Camacho et al.

Page 1 of 1

It is certified that error appears in the above-identified patent and that said Letters Patent is hereby corrected as shown below:

In the Claims:

Column 10, Claim 16, line 29, delete "is a" and insert therefor --element is a--

Signed and Sealed this  
Fifteenth Day of December, 2015

Michelle K. Lee  
*Director of the United States Patent and Trademark Office*